(12) United States Patent
Lee et al.

(10) Patent No.: US 9,779,820 B1
(45) Date of Patent: Oct. 3, 2017

(54) NON-VOLATILE MEMORY AND PROGRAMMING METHOD THEREOF

(71) Applicant: MACRONIX International Co., Ltd., Hsinchu (TW)

(72) Inventors: Ya-Jui Lee, Hsinchu (TW); Kuan-Fu Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/440,889

(22) Filed: Feb. 23, 2017

(51) Int. Cl.
G11C 16/06 (2006.01)
G11C 16/10 (2006.01)
G11C 16/24 (2006.01)
G11C 16/08 (2006.01)

(52) U.S. Cl.
CPC .............. *G11C 16/10* (2013.01); *G11C 16/08* (2013.01); *G11C 16/24* (2013.01)

(58) Field of Classification Search
CPC .......... G11C 16/06; G11C 16/08; G11C 16/24
USPC ....................... 365/185.01–185.33
See application file for complete search history.

(56) References Cited

U.S. PATENT DOCUMENTS

| | | | |
|---|---|---|---|
| 7,623,387 B2 | 11/2009 | Dong et al. | |
| 8,854,890 B1 | 10/2014 | Miwa | |
| 8,988,945 B1 | 3/2015 | Miwa | |
| 2003/0048662 A1* | 3/2003 | Park | G11C 16/12 365/185.18 |
| 2004/0233726 A1* | 11/2004 | Iwase | G11C 11/22 365/185.22 |
| 2004/0233727 A1* | 11/2004 | Iwase | G11C 11/22 365/185.22 |
| 2008/0084747 A1* | 4/2008 | Hemink | G11C 7/1006 365/185.18 |
| 2008/0159004 A1* | 7/2008 | Hemink | G11C 11/5628 365/185.25 |
| 2008/0279007 A1 | 11/2008 | Dong et al. | |
| 2014/0112075 A1 | 4/2014 | Dunga et al. | |

OTHER PUBLICATIONS

Dongyean Oh et al., "A New Self-Boosting Phenomenon by Soure/Drain Depletion Cut-off in NAND Flash Memory", Non-Volatile Semiconductor Memory Workshop, 2007 22nd IEEE , Aug. 2007, pp. 39-41.

* cited by examiner

*Primary Examiner* — Harry W Bryne
(74) *Attorney, Agent, or Firm* — J.C. Patents

(57) ABSTRACT

A non-volatile memory and a programming method thereof are provided. The programming method for the non-volatile memory includes: setting at least one first isolation cell between a first side cell and at least one first pass cell of an inhibited memory string; cutting off the at least one first isolation cell and providing a pre-boosting voltage to a word line of the first side cell and at a first time point; turning on the at least one first isolation cell at a second time point for transporting the pre-boosting potential to channels of the at least one first pass cell and a primary cell at a second time period; and providing a boosting voltage to word lines of the at least one first pass cell during a boosting time period.

14 Claims, 5 Drawing Sheets

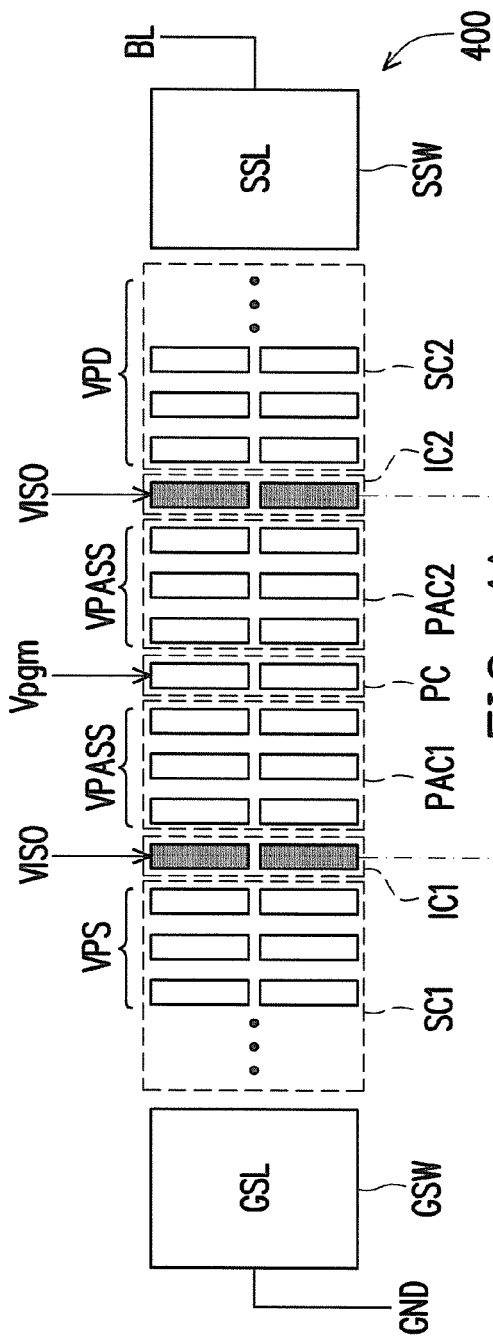
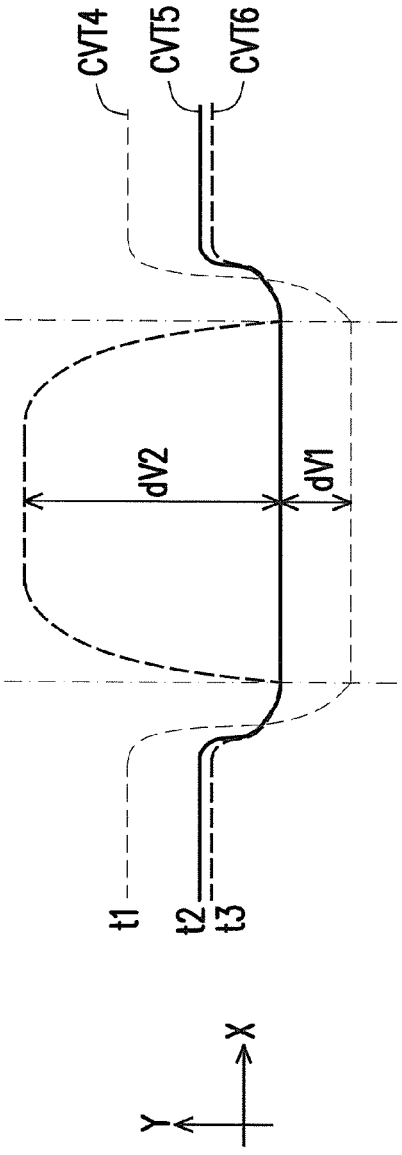
FIG. 4A
FIG. 4B

NON-VOLATILE MEMORY AND PROGRAMMING METHOD THEREOF

TECHNICAL FIELD

The invention relates to a non-volatile memory and a programming method thereof. Particularly, the invention relates the programming method for enhance boosting channel potential of an inhibited memory string.

BACKGROUND

For a multi-level cell (MLC) NAND flash memory, local self-boosting method is widely used to prevent program disturbance in conventional art. This conventional method locally boosts some of inhibited string region by cutting off channel of memory cell. To inhibit a cell properly, a channel potential of the inhibited cell should be high enough to reduce electrical field across the tunnel oxide to avoid Fowler-Nordheim (FN) tunneling.

As dimension scaling down, a boosting ratio degrades obviously due to large parasitic capacitance. This weak boosting condition is also correlative to data pattern of neighboring cell and the worst case usually happen when neighboring bit line is programmed. In conventional art, some operation methods are proposed to improve this problem, for example, pair bits program scheme. But such schema also worsen program performance. Therefore, providing a program method which can improve boosting potential without performance loss is an important course for an engineer in this art.

SUMMARY

Some embodiments of the disclosure are directed to a non-volatile memory and a programming method thereof, which can increase a channel potential of the inhibited memory string to prevent the program disturbance.

In one embodiment of the disclosure provides the programming method for the non-volatile memory including: setting at least one first isolation cell between a first side cell and at least one first pass cell of an inhibited memory string; cutting off the at least one first isolation cell and providing a pre-boosting voltage to a word line of the first side cell and at a first time point; turning on the at least one first isolation cell at a second time point for transporting the pre-boosting voltage to pre-boosting channels of the at least one first pass cell and a primary cell at a second time period; and providing a boosting voltage to word lines of the at least one first pass cell during a boosting time period.

In another embodiment of the disclosure also provides the non-volatile memory including a memory cell array, a X-decoder, a Y-decoder, and a memory controller. The memory cell array includes a plurality of memory strings. The X-decoder is coupled to the memory cell array. The Y-decoder is coupled to the memory cell array, too. The memory controller is coupled to the X-decoder and the Y-decoder, and is configured to: set at least one first isolation cell between a first side cell and at least one first pass cell of an inhibited memory string; cut off the at least one first isolation cell and provide a pre-boosting voltage to a word line of the first side cell and at a first time point; turn on the at least one first isolation cell at a second time point for transporting the pre-boosting voltage to pre-boosting channels of the at least one first pass cell and a primary cell at a second time period; and provide a boosting voltage to word lines of the at least one first pass cell during a boosting time period.

According to the above descriptions, at least one of the disclosure provides a pre-boosting voltage to the drain cell and the source cell in sides of the inhibited memory string, then providing the boosting voltage to the pass cells. That is, a channel potential of the inhibited memory cell can be pre-boosting by coupling the pre-boosting voltage, and be further boosted up when the boosting voltage be provided to the pass cells. Such as that, the program disturbance to the inhibited memory cell can be reduced efficiency, and the inhibited memory cell can be inhibited well.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A and FIG. 4B illustrate a schematic diagram of an inhibited memory cell and potentials of channels thereof according to another embodiment of present disclosure.

DETAILED DESCRIPTION OF DISCLOSED EMBODIMENTS

Figure 1:
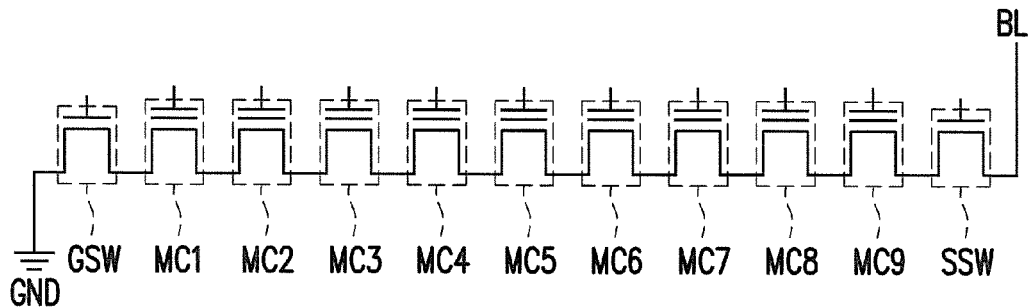
FIG. 1 illustrates a schematic diagram of a memory string of a NAND flash memory according to an embodiment of present disclosure.

Please refer to FIG. 1, FIG. 1 illustrates a schematic diagram of a memory string of a NAND flash memory according to an embodiment of present disclosure. The memory string 100 is coupled to a bit line BL, and includes a plurality of memory cells MC1-MC9, a ground select switch GSW and a bit line select switch SSW. The memory cells MC1-MC9 are coupled in series between the ground select switch GSW and the bit line select switch SSW. A first end of the bit line select switch SSW is coupled to the bit line BL, a second end is coupled to the memory cell MC9. A first end of the ground select switch GSW is coupled to the memory cell MC1 and a second end the ground select switch GSW is coupled to a ground GND.

Please be noted here, number of cells in one memory string is not limited, and the memory string 100 having nine cells in FIG. 1 is only an example.

Figure 2:
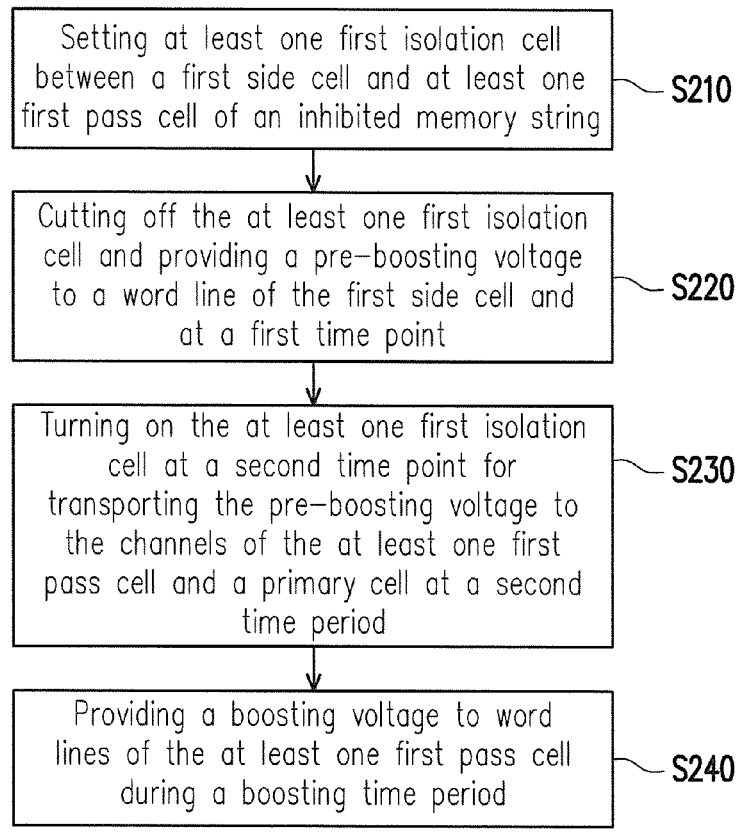
FIG. 2 illustrates a flow chart of a programming method for a non-volatile memory.
Figure 3A:
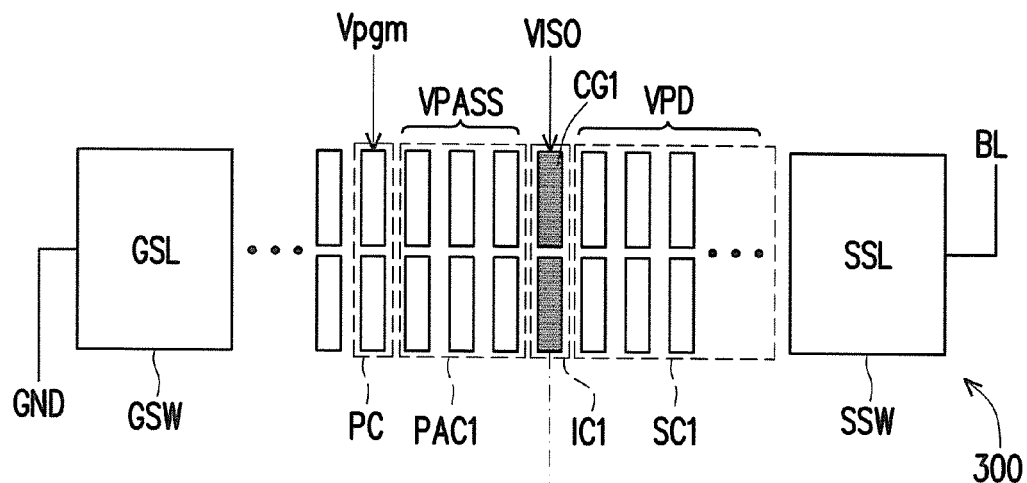
FIG. 3A and FIG. 3B illustrate a schematic diagram of an inhibited memory cell and potentials of channels thereof according to an embodiment of present disclosure.
Figure 3B:
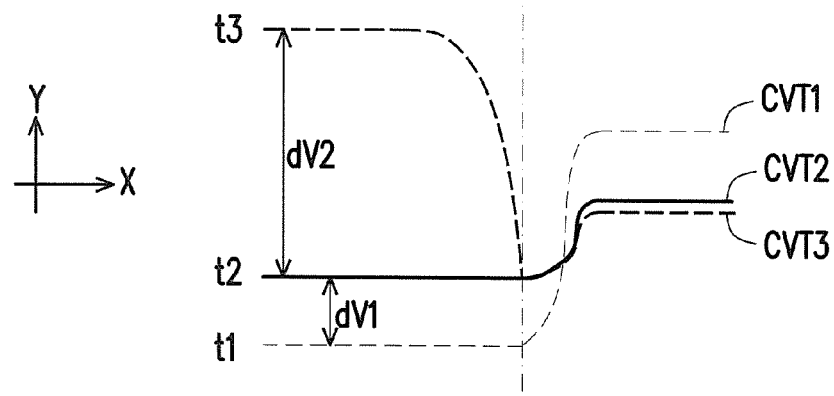
Figure 5:
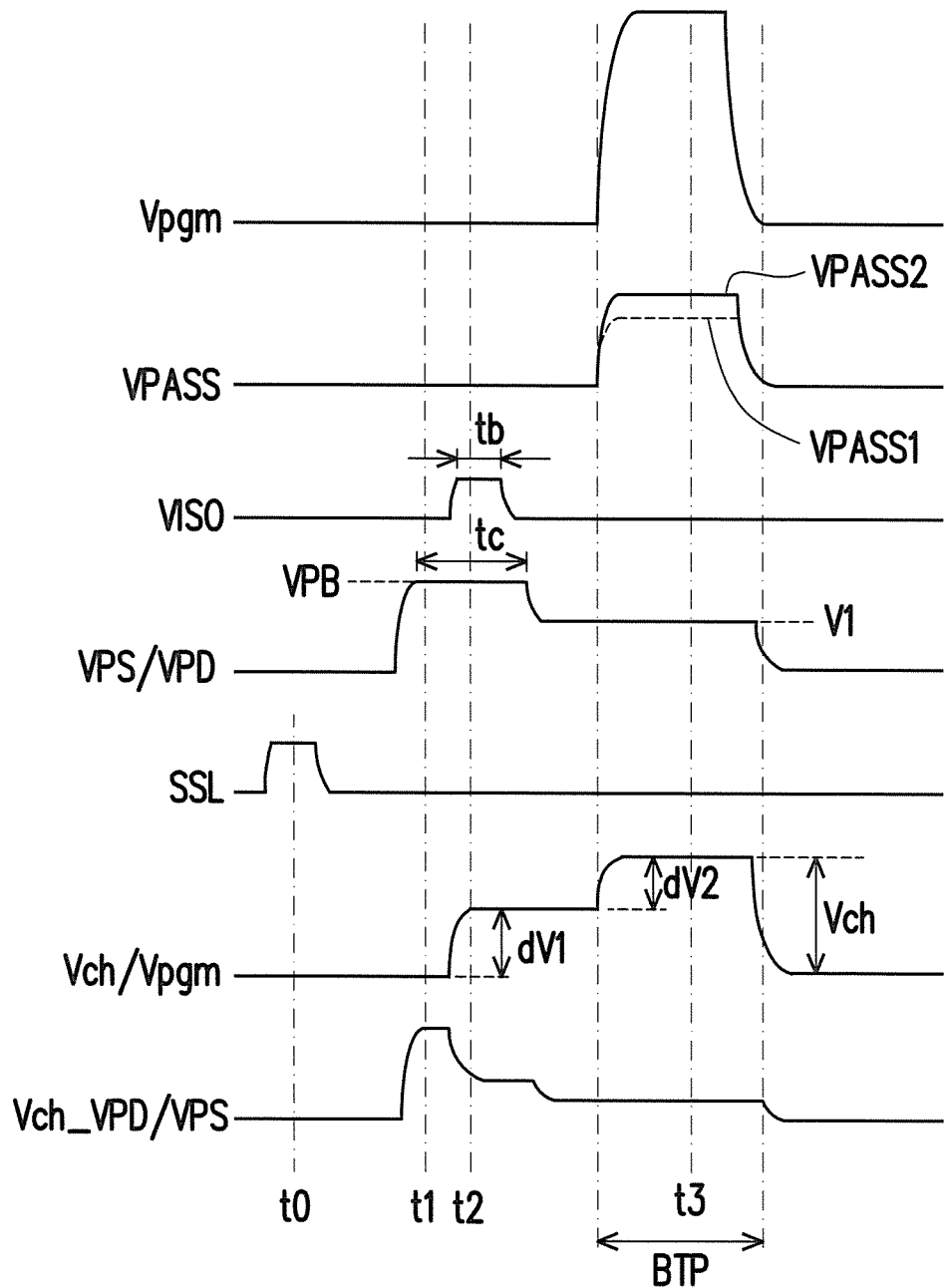
FIG. 5 illustrates a waveform plot of the programming method according to an embodiment of present disclosure.

Please refer to FIG. 2, FIG. 2 illustrates a flow chart of a programming method for a non-volatile memory. Herein, please also referring to FIG. 3A, FIG. 3B and FIG. 5 commonly, wherein FIG. 3A and FIG. 3B illustrate a schematic diagram of an inhibited memory cell and potentials of channels thereof according to an embodiment of present disclosure, and FIG. 5 illustrates a waveform plot of the programming method according to an embodiment of present disclosure. In FIG. 3A, a plurality of cells are included in the inhibited memory cell 300. Each of the cells is illustrated by two rectangle blocks arranged in vertical direction, one of the two rectangle blocks (the lower one) is a floating gate of the cell, and another one of the two rectangle blocks (the upper one) is a control gate of the cell. The cells are coupled in series between a ground select switch GSW and a bit line select switch SSW, wherein the bit line select switch SSW is connected to the bit line BL and the ground select switch GSW is connected to the reference ground GND. In FIG. 3B, the Y-axis represents channel potential, and the X-axis represents positions.

In this embodiment, the memory string 300 is selected to be an inhibited memory string. Initially, a control signal SSL with high level is transported to a bit line selection switch SSW to for turning on the bit line selection switch SSW at a time point t0. A bit line BL coupled to the inhibited memory string 300 is pre-charged accordingly. Then, for reducing program disturbance of an inhibited memory string, a step S210 may be executed for setting a isolation cell IC1 between a side cell (one of the side cells SC1) and a pass cell (one of the pass cells PAC1) of the inhibited memory string 300. If a word line of a primary cell PC is coupled to a selected word line for receiving a program voltage Vpgm, one or more cell(s) disposed between the pass cells PAC1 and side cells SC1 may be selected to be isolated cell(s) IC1. In this embodiment, the side cells SC1 may be closed to the bit line selection switch SSW, and in another embodiment, the side cells SC1 may be closed to the ground selection switch GSW. Furthermore, the pass cells PAC1 receive a word line signal VPASS, the isolation cell receives a word line signal VISO, the side cells SC1 receives a word line signal VPD.

Then, a step S220 for cutting off the isolation cell IC1 and providing a pre-boosting voltage to the word line of the side cells SC1 and at a first time point t1 can be executed. Herein, the isolation signal VISO with a low level is applied to a control gate CG1 of the isolation cell IC1, and the isolation cell IC1 can be cut off accordingly. Furthermore, at the same time, the pre-boosting voltage is carried on the word line signal VPD to be provided to the side cells SC1. By referring to a curve CVT1, potentials Vch_VPD in the channels of the side cells SC1 are pre-boosted to a related high level, and the potential Vch_Vpgm in the channels of the primary cell PC and the potentials in the channels of the pass cells PAC1 are kept at a related low level.

After the time point t1, a step S230 for turning on the isolation cell IC1 at a second time point t2 for transporting pre-boosting potential to the channels of the pass cells PAC1 and the primary cell PA at a second time period t2 can be executed. The isolation cell IC1 is turned on by providing the word line signal VISO with a high level to the control gate CG1 of the isolation cell IC1. By referring to a curve CVT2, at the second time point t2, and the potential Vch_Vpgm in channels of the primary cell PC and the potentials in the channels of the pass cells PAC1 are charged up by pre-boosting potential in the side cells SC1 through the turned on isolation cell IC1. That is, channel potential is sharing between pass cells PAC1 and side cells SC1 while isolation cell IC1 is tuned on. Such as that, the potential Vch_Vpgm in the primary cell PC and the potentials in the channels of the pass cells PAC1 may be increased by a voltage dV1. Besides, the potentials Vch_VPD in the side cells SC1 may be decreased correspondingly at the time point t2.

After the time point t2, a step S240 for providing a boosting voltage to word lines of the pass cells PAC1 during a boosting time period BTP can be executed. At the time point t3 in the boosting time period BTP, the boosting voltage VPASS1 carried on the word line signal VPASS is applied on the word lines of the pass cells PAC1, and the potentials in the channels of the pass cells PAC1 can be boosted up. At the same time, the programming voltage Vpgm with high level may be applied to the word line of the primary cell PC, and the potential Vch_Vpgm in the channel of the primary cell PC can be boosted up, too. By referring to a curve CVT3, the potentials in the pass cells PAC1 and the potential Vch_Vpgm in the channel of the primary cell PC are boosted-up from the voltage dV1 to a voltage Vch=dV1+dV2 by coupling the boosting voltage VPASS1 carried on the word line signal VPASS. Such as that, the memory string 300 can be inhibited well, and the program disturbance can be reduced when the primary cell PC receives the programming voltage Vpgm.

Please be noted here, a voltage level of the pre-boosting voltage is not larger than a voltage level of the boosting voltage VPASS1. The time point t0, t1, t2 and t3 are arranged in sequential. A turned-on time interval tb of the isolation cell IC1 is smaller than a time interval tc for the pre-boosting voltage being applied on the side cells SC1. In detail, the pre-boosting voltage is carried on the word line signal VPD to be applied to the side cells SC1 before the isolation cell IC1 being turned on, and the word line signal VPD be reduced to a first voltage V1 after the isolation cell IC1 being cut off. Wherein, a voltage level of the first voltage is smaller than a voltage level of the pre-boosting voltage.

Please refer to FIG. 4A, FIG. 4B and FIG. 5 commonly, wherein FIG. 4A and FIG. 4B illustrate a schematic diagram of an inhibited memory cell and potentials of channels thereof according to another embodiment of present disclosure. In FIG. 4A, two of cells in the inhibited memory string 400 mays selected to be isolation cells IC1 and IC2. Herein, the isolation cell IC1 is disposed between the side cells SC1 and the pass cells PC1, and the isolation cell IC2 is disposed between the side cells SC2 and the pass cells PC2. In FIG. 4B, the Y-axis represents channel potential, and the X-axis represents positions. In the operation, the bit line selection switch SSW is turned on for pre-charging the bit line BL at the time point t0. Then, the isolation cells IC1 and IC2 are cut-off by applying the word line signal VISO with a low level to the isolation cells IC1 and IC2 at the time point t1, and the pre-boosting voltage VPB is carried on the word line signals VPD and VPS to be respectively provided to word lines coupled to the side cells SC2 and the side cells SC1. By referring to a curve CVT4, the potentials Vch_VPD and Vch_VPS in the channels of the side cells SC1 and SC2 are pre-boosted to a related high level, and the potential Vch_Vpgm in the channel of the primary cell PC and the potentials in the channels of the pass cells PAC1 and PAC2 are kept at a related low level.

After the time point t1, the isolation cells IC1 and IC2 are turned on at a second time point t2 for transporting the potentials Vch_VPD and Vch_VPS in the channels of the side cells SC1 and SC2 to the channels of the pass cells PAC1 and the primary cell PA at a second time period t2. The isolation cells IC1 and IC2 may be turned on by providing the word line signal VISO with a high level to the control gates of the isolation cells IC1 and IC2. At this time, by referring to a curve CVT5, the isolation cells IC1 and IC2 are turned on, and the potential Vch_Vpgm in channels of the primary cell PC and the potentials in the channels of the pass cells PAC1 and PAC2 are charged up according to the potentials Vch_VPD and Vch_VPS in the side cells SC1 and SC2. That is, channel potential is sharing between the pass cells PAC1/PAC2 and the side cells SC1/SC2 while the isolation cells IC1 and IC2 are tuned on. Such as that, the potential Vch_Vpgm in the channel of the primary cell PC and the potentials in the channels of the pass cells PAC1 and PAC2 are increased by a voltage dV1. Besides, the potentials Vch_VPD and Vch_VPS in the channels of the side cells SC1 and SC2 are decreased correspondingly at the time point t2.

After the time point t2, and during the boosting time period BTP, a boosting voltage VPASS2 is carried on the word line signal VPASS to be provided to word lines of the pass cells PAC1 and PAC2 at the time point t3. At the same time, the programming voltage Vpgm may be applied to the word line of the primary cell PC. At the time point t3 in the boosting time period BTP, by referring to a curve CVT6, the potentials in the channels of the pass cells PAC1 and PAC2 and the potential Vch_Vpgm in the channel of the primary cell PC are boosted-up from the voltage dV1 to the voltage Vch=dV1+dV2 by coupling the boosting voltage VPASS. Such as that, the memory string 400 also can be inhibited well, and the program disturbance can be reduced when the primary channel PC receives the programming voltage Vpgm.

Besides, in this embodiment, the ground selection switch GSL of the inhibited memory string 400 is always cut-off during the programming operation.

Figure 6:
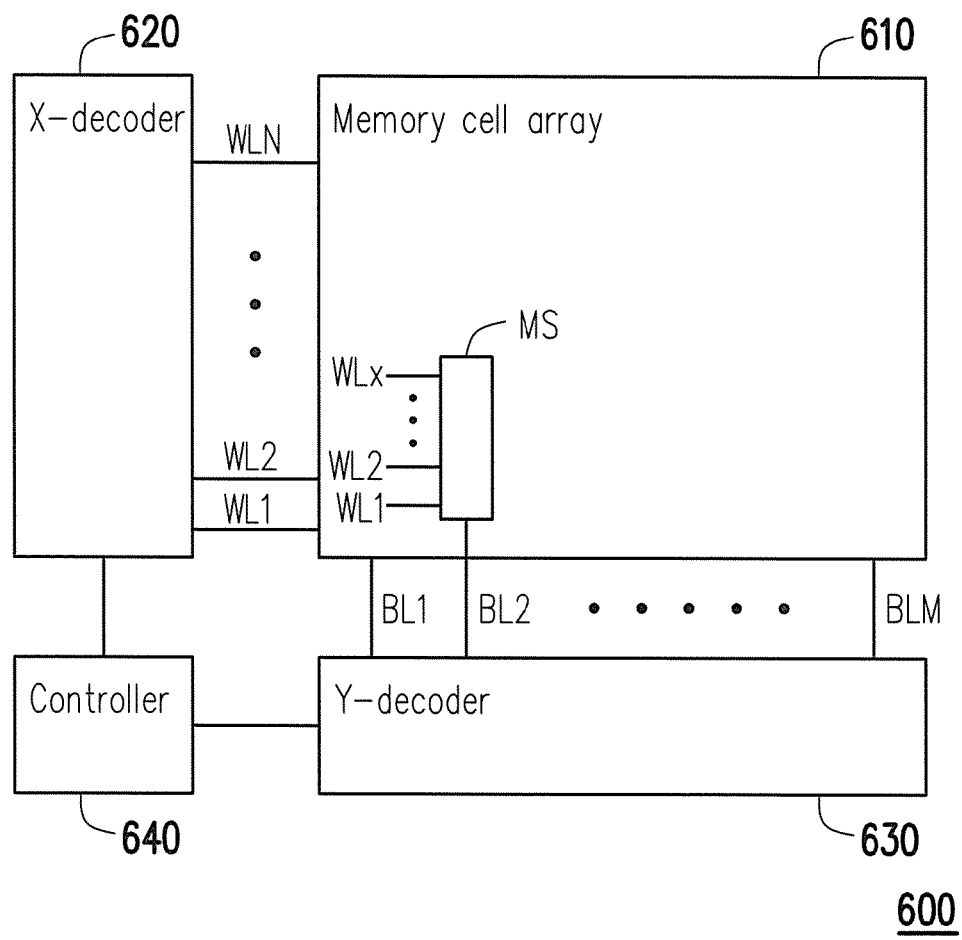
FIG. 6 illustrates a schematic diagram of a non-volatile memory according to an embodiment of present disclosure.

Please refer to FIG. 6, FIG. 6 illustrates a schematic diagram of a non-volatile memory according to an embodiment of present disclosure. The non-volatile memory 600 includes a memory cell array 610, a X-decoder 620, a Y-decoder 630 and a controller 640. The memory cell array 610 includes a plurality of memory strings MS, and each of the memory cells includes a plurality of memory cells. The X-decoder 620 is coupled to the memory cell array, and the X-decoder 620 provides a plurality of word line signals WL1-WLN to the memory cell array 610. The Y-decoder 630 is coupled to the memory cell array 610, and the Y-decoder 630 provides a plurality of bit line signals on the bit lines BL1-BLM to the memory cell array 610.

For example, the memory cell MS is coupled to the bit line BL2, and receive the world line signals WL1-WLx. During a programming operation, if the memory string MS is selected to be an inhibited line, the controller 640 may be configured to execute the steps in FIG. 2, and program disturbance to the memory string MS can be reduced.

The details of the steps executed by the controller 640 are already described in above embodiments, and not more repeated description here.

In summary, present disclosure provides a local boosting scheme, for cutting off a path between the pass cells and the primary cell and the side cell, and pre-boosting the side cells. Then, turning on the isolation cell to transport the pre-boosting potentials to the channels of the pass cells and the primary cell. That is, when the pass cells are boosted-up, the potentials in the channels of the pass cells and the primary cell can be promote to a higher value, and programming disturbance to the inhibited memory string can be reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A programming method for a non-volatile memory, comprising:
    setting at least one first isolation cell between a first side cell and at least one first pass cell of an inhibited memory string;
    cutting off the at least one first isolation cell and providing a pre-boosting voltage to a word line of the first side cell and at a first time point;
    turning on the at least one first isolation cell at a second time point for transporting pre-boosting potential to channels of the at least one first pass cell and a primary cell according to the pre-boosting voltage at a second time period; and
    providing a boosting voltage to word lines of the at least one first pass cell during a boosting time period,
    wherein a voltage level of the pre-boosting voltage is not larger than a voltage of the boosting voltage.

2. The programming method as claimed in claim 1, further comprising:
    setting at least one second isolation cell between a second side cell and at least one second pass cell of the inhibited memory string;
    cutting off the at least one second isolation cell and providing the pre-boosting voltage to a word line of the second side cell and at the first time point; and
    turning on the at least one second isolation cell at the second time point for transporting the pre-boosting voltage to the channel of the at least one second pass cell and the primary cell at the second time period.

3. The programming method as claimed in claim 1, further comprising:
    charging up a voltage level of a bit line coupled to the inhibited memory string before the first time point.

4. The programming method as claimed in claim 1, further comprising:
    holding voltages on the word lines of the at least one first pass cell and the primary cell to a reference ground before the boosting time period.

5. The programming method as claimed in claim 1, further comprising:
    cutting off a ground select switch coupled between the inhibited memory string and a reference ground before the first time point; and
    turning on a bit line select switch coupled between the inhibited memory string and a bit line before the first time point.

6. The programming method as claimed in claim 1, further comprising:
    adjusting voltage levels on the word lines of the at least one first side cell to a first voltage level after the second time point; and
    cutting off the at least one first isolation cell after the second time point,
    wherein the first voltage level is smaller than a voltage level of the pre-boosting voltage.

7. The programming method as claimed in claim 6, further comprising:
    holding the voltage levels on the word lines of the at least one first side cell to the first voltage level during the boosting time period.

8. A non-volatile memory, comprising:
    a memory cell array, comprising a plurality of memory strings;
    a X-decoder, coupled to the memory cell array;
    a Y-decoder, coupled to the memory cell array;

a memory controller, coupled to the X-decoder and the Y-decoder, and being configured to:
set at least one first isolation cell between a first side cell and at least one first pass cell of an inhibited memory string;
cut off the at least one first isolation cell and provide a pre-boosting voltage to a word line of the first side cell and at a first time point;
turn on the at least one first isolation cell at a second time point for transporting pre-boosting potential to channel of the at least one first pass cell and a primary cell at a second time period; and
provide a boosting voltage to word lines of the at least one first pass cell during a boosting time period,
wherein a voltage level of the pre-boosting voltage is not larger than a voltage of the boosting voltage.

9. The non-volatile memory as claimed in claim 8, wherein the memory controller is further configured to:
set at least one second isolation cell between a second side cell and at least one second pass cell of the inhibited memory string;
cut off the at least one second isolation cell and provide the pre-boosting voltage to a word line of the second side cell and at the first time point; and
turn on the at least one second isolation cell at the second time point for transporting the pre-boosting voltage to pre-boosting the channels of the at least one second pass cell and the primary cell at the second time period.

10. The non-volatile memory as claimed in claim 8, wherein the memory controller is further configured to:
charge up a voltage level of a bit line coupled to the inhibited memory string before the first time point.

11. The non-volatile memory as claimed in claim 8, wherein the memory controller is further configured to:
hold voltages on the word lines of the at least one first pass cell and the primary cell to a reference ground before the boosting time period.

12. The non-volatile memory as claimed in claim 8, wherein the memory controller is further configured to:
cut off a ground select switch coupled between the inhibited memory string and a reference ground before the first time point; and
turn on a bit line select switch coupled between the inhibited memory string and a bit line before the first time point.

13. The non-volatile memory as claimed in claim 8, wherein the memory controller is further configured to:
adjust voltage levels on the word lines of the at least one first side cell to a first voltage level after the second time point; and
cut off the at least one first isolation cell after the second time point,
wherein the first voltage level is smaller than a voltage level of the pre-boosting voltage.

14. The non-volatile memory as claimed in claim 8, wherein the memory controller is further configured to:
hold the voltage levels on the word lines of the at least one first side cell on the first voltage level during the boosting time period.

* * * * *